(12) United States Patent
Kononchuk (10) Patent No.: US 8,067,298 B2
(45) Date of Patent: Nov. 29, 2011

(54) RELAXATION OF A STRAINED MATERIAL LAYER WITH APPLICATION OF A STIFFENER

(75) Inventor: Oleg Kononchuk, Theys (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/574,142

(22) Filed: Oct. 6, 2009

(65) Prior Publication Data

US 2010/0087049 A1    Apr. 8, 2010

(30) Foreign Application Priority Data

Oct. 7, 2008   (FR) ..................................... 08 05532

(51) Int. Cl.
*H01L 21/20* (2006.01)
*H01L 21/36* (2006.01)

(52) U.S. Cl. .................. 438/478; 438/509; 257/E21.09; 257/E21.12

(58) Field of Classification Search .................. 438/478; 257/616, E21.09, E21.12, E21.119, E21.568
See application file for complete search history.

(56) References Cited

U.S. PATENT DOCUMENTS

2004/0192067 A1    9/2004 Ghyselen et al.
2004/0195656 A1*  10/2004 Ghyselen et al. ............. 257/616
2005/0003641 A1*   1/2005 Faure ............................ 438/509

OTHER PUBLICATIONS

"Buckling Suppression of SiGe Islands on Compliant Substrates," Nov. 15, 2003; Journal of Applied Physics, vol. 94, No. 10.
"Strain Relaxation of SiGe Islands on Compliant Oxide," Jun. 15, 2002; Journal of Applied Physics, vol. 91, No. 12.
SG-2009051467-HU Search Report, Sep. 16, 2010, S.O.I.TEC Silicon on Insulator Technologies.

* cited by examiner

*Primary Examiner* — Charles Garber
*Assistant Examiner* — Abdulfattah Mustapha
(74) *Attorney, Agent, or Firm* — Edwards Wildman Palmer LLP; George W. Neuner; George N. Chaclas (57) ABSTRACT

The invention relates to methods of fabricating a layer of at least partially relaxed material, such as for electronics, optoelectronics or photovoltaics. An exemplary method includes supplying a structure that includes a layer of strained material situated between a reflow layer and a stiffener layer. The method further includes applying a heat treatment that brings the reflow layer to a temperature equal to or greater than the glass transition temperature of the reflow layer, and the thickness of the stiffener layer is progressively reduced during heat treatment. The invention also relates to an exemplary method of fabricating semiconductor devices on a layer of at least partially relaxed material. Specifically, at least one active layer may be formed on the at least partially relaxed material layer. The active layer may include laser components, photovoltaic components and/or electroluminescent diodes.

31 Claims, 6 Drawing Sheets

RELAXATION OF A STRAINED MATERIAL LAYER WITH APPLICATION OF A STIFFENER

CROSS-REFERENCE TO RELATED APPLICATIONS

This patent application claims priority to French Patent Application No. 0805532, filed on Oct. 7, 2008. The aforementioned patent application is incorporated by reference herein in its entirety.

BACKGROUND

1. Field of the Invention

The present invention relates to methods of fabricating a layer of strained material that is then caused to become at least partially relaxed for applications such as electronics, optoelectronics and photovoltaics. Disclosed methods generally include providing of a structure that includes a strained material layer situated between a reflow layer and a stiffener layer, and applying a heat treatment that brings the reflow layer to a temperature equal to or greater than the glass transition temperature of the reflow layer. In other aspects, the invention also relates to fabricating semi-conductor devices from the layer of material that is at least partially relaxed.

2. Description of Related Art

When substrates are unavailable or are very expensive in solid form, they may be obtained in thinner layers by epitaxial growth on seed substrates. Nevertheless, the properties of these seed substrates are not always adapted to the materials from which one wishes to carry out the growth. In fact, seed substrates may present, for example, a thermal expansion coefficient and a lattice parameter that are different from those of the materials from which one wishes to carry out growth, which produces a certain number of defects in the layer formed, such as cracks that may develop during the growth or cooling of the structure, or the presence of lattice defects that reduce the efficacy of the devices formed later, or even the compression stress or tension stress of the layer.

Techniques for relaxing such strained material layers are known, particularly by introducing a reflow layer between the strained layer and a support substrate. But these techniques do not yield completely satisfactory results, as the strained layer is not always or completely relaxed elastically. The structure formed from a layer stack may also be degraded, and in order for the layer to relax, it may detach from the remainder of the structure. In addition, when the material is compression strained, this elastic relaxation may lead to buckling of the material, the roughness and amplitude between the peaks and valleys of the buckled layer then cannot be reconciled with the desired utilizations. When the material is tension strained, the relaxation often produces cracks and an increase in surface roughness.

The article "buckling suppression of SiGe islands on compliant substrates" by H. Yin et al. (in the Journal of Applied Physics, vol 94, number 10, published on Nov. 15, 2003) describes the elastic, lateral and buckling relaxations of compression stressed materials as implementing two competitive phenomena. According to this document, a first phenomenon consists of the lateral relaxation of the strained material; this relaxation then propagates from the edges of the film or islands formed in the film to the center of the film or island. It is thus explained that the smaller the island, the faster the lateral relaxation (which is accentuated by the thickness of the strained material layer). This lateral relaxation enables a film of substantially flat relaxed material to be obtained, with low surface roughness. For example, 60 micrometers×60 micrometers SiGe islands from epitaxy on an initial silicon substrate with a 30% Germanium content relax laterally and lead to obtaining a flat film whose roughness RMS is less than 2 nm.

As further explained in the aforementioned article, the second phenomena is relaxation by buckling, wherein the speed does not depend on the surface of the film or the island to be relaxed but rather on the stress in the material. Buckling leads to obtaining a film that is at least partially relaxed but very rough. It is possible that the film will fracture if the roughness exceeds a critical value. This phenomenon is particularly evidence in relatively thin films, which allow easy deformation, and thus, buckling.

In order to obtain a relaxed material with the best morphology, H. Yin recommends slowing down the buckling phenomenon and promoting the lateral relaxation phenomenon. To do this, he proposes depositing a layer of non-strained material on the film of material to be relaxed. This layer allows the total thickness of the material on the reflow layer to be increased by forming a bilayer (strained material layer and covering layer) and thus allows the lateral relaxation speed to be increased. The deposition of this covering layer also allows a bilayer structure that is mechanically more rigid with a lower propensity for curvature to be obtained. In addition, as the mean stress in the bilayer is lower due to the fact of the free deposition of the covering layer, the buckling force is lower. But, in terms of heat treatment, relaxation remains partial in the initially strained material. In fact, the relaxation is interrupted when the stresses are balanced in the bilayer. A multi-cycle method is then proposed in order to encourage lateral relaxation to the detriment of buckling relaxation. This is to carry out heat treatment on the bilayer until the relaxation allowed by the new stress balance is obtained, then the covering layer is reduced by a given thickness which allows a new stress balance and a new partial relaxation to be obtained at the end of the second relaxation annealing, while reducing the buckling relaxation phenomenon. These thinning/annealing steps are repeated until the covering layer is completely removed. The thickness of the covering layer to be removed may be identical at each cycle or may be variable and defined as being half of the thickness of the covering layer from the previous cycle. Optimization of the cycles combining these two variations is also planned but the relaxation method remains relatively long to put in place.

SUMMARY OF THE DISCLOSURE

Advantages of the present invention will be set forth in and become apparent from the description that follows. Additional advantages of the invention will be realized and attained by the methods and systems particularly pointed out in the written description and claims hereof, as well as from the appended drawings.

To achieve these and other advantages and in accordance with the purpose of the invention, as embodied herein, the disclosed embodiments remedy the aforementioned disadvantages, and permit fabrication of a layer of a material that is at least partially relaxed for electronics, optoelectronics or photovoltaics rapidly, effectively and in a practical manner.

In accordance with one embodiment, the aforementioned goal is accomplished by providing a method that includes a progressive reduction in the thickness of the stiffener layer during application of the heat treatment. Preferably, the progressive reduction is continuous.

In accordance with a further aspect, fabrication methods are provided that include a step of forming islands, in particular by etching or electromagnetic irradiation, in the strained material layer, such as before application of a heat treatment.

According to a particular embodiment, the strained material layer can be formed through the following successive steps. First, monocrystalline or polycrystalline strained material layer is deposited on a nucleation substrate. Next, the strained material layer is assembled with a support substrate by way of a reflow layer. The nucleation substrate can then be at least partially removed.

In accordance with a further aspect of the aforementioned method, the removal of the nucleation substrate can be partial, and the stiffener layer can be formed at least in part by the remainder of the nucleation substrate. According to a particular aspect, the reflow layer is preferably constituted of at least one low-viscosity material. In accordance with a particular embodiment, the material of the reflow layer can be a borophosphosilicate glass that includes between 3% and 7% boron; preferably between 3 and 5%. Preferably, the stiffener layer includes GaN, the strained material layer includes InGaN and the etching of the stiffener layer is performed in an atmosphere that includes HCl.

In other aspects, the disclosure also relates to a method of fabricating semiconductor devices that includes supplying a layer in a material that is at least partially relaxed (as described herein), and forming at least one active layer on the at least partially relaxed material layer. In particular, these active layers can be the active layers of laser components, photovoltaic components or electroluminescent diodes.

According to a particular embodiment of a method, the at least partially relaxed material layer includes a III/N material, the active layer or layers include a III/N material, and the formation of the active layer or layers is carried out by epitaxy on the face of the III element of the material from the at least partially relaxed material layer.

It is to be understood that the foregoing general description and the following detailed description are exemplary and are intended to provide further explanation of the disclosed embodiments.

The accompanying drawings, which are incorporated in and constitute part of this specification, are included to illustrate and provide a further understanding of the disclosed methods, and resulting structures. Together with the description, the drawings serve to explain principles of the disclosed embodiments.

BRIEF DESCRIPTION OF THE FIGURES

Other characteristics, objects and advantages of the invention will emerge from the following detailed description, with reference to the attached figures in which.

DETAILED DESCRIPTION

Reference will now be made in detail to the present preferred embodiments, examples of which are illustrated in the accompanying drawings and accompanying text.

Figure 1:
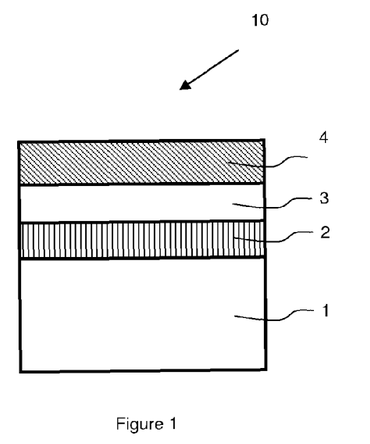
FIGS. 1 and 2 illustrate a first embodiment according to the invention.
Figure 2:
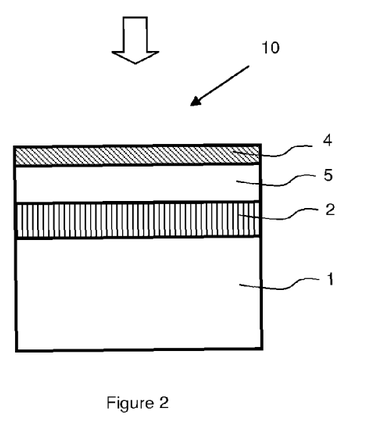

For purposes of illustration, and not limitation, FIG. 1 represents a structure 10 having a layer of strained material 3 situated between a reflow layer 2 and a stiffener layer 4. Preferably, structure 10 also includes a support substrate 1 on which the reflow layer 2 lies. Substrate 1 is adapted to reinforce the rigidity of the structure 10 during heat treatment. Heat treatment is applied to bring the reflow layer 2 to a temperature equal to or greater than its glass transition temperature during which the thickness of the stiffener layer 4 is progressively reduced, as illustrated in FIG. 2.

It is noted that a material is referred to as being strained respectively in tension or in compression in the interface plane with the material on which it lays when its lattice parameter is respectively greater than or less than its nominal lattice parameter, that is, its lattice parameter in the natural state. It is also indicated that the term "layer" must be understood in the broad sense of the term, that is, that the layer may be continuous or discontinuous.

The term "reflow layer" is understood to refer to a layer of an amorphous material that flows and becomes viscous when it is brought to a temperature beyond its glass transition temperature. Preferably, a low-viscosity reflow layer (i.e., a layer whose glass transition temperature is rather low) is used in accordance with embodiments of the invention. For example, the glass transition temperature of a high-viscosity oxide is on the order of 1000° C. to about 1200° C.; the glass transition temperature of a low-viscosity oxide is typically situated between 600° C. to 1000° C.

The amorphous material of the reflow layer 2 according to the invention may be a glass such as a lithium-based glass or an oxide such as $SiO_2$, doped by boron, or by boron and phosphorus to form a borosilicate glass (bsg) or borophosphosilicate glass (bpsg). As the proportion of boron determines the glass transition temperature of the oxide, it is thus possible to fix the oxide composition to make it viscous at a desired temperature. For example the glass transition temperature of a layer of bpsg that contains 4.5% of boron is approximately 650° C. The material of the reflow layer 2 may be chosen such that the heat treatment may be carried out between 750° C. and 1050° C., and preferably between 850° C. and 950° C.

In conformance with a particular embodiment of the invention, the reflow layer 2 is in borophosphosilicate glass and the boron content of the oxide is preferably between 7% and 3%. When one wishes to operate at a temperature over 850° C., the boron content is preferentially less than or equal to 4%.

Thus, when the reflow layer 2 of the structure 10 is brought beyond the glass transition temperature that enables the layer material to transition to the viscous state, the strained material layer 3 may at least partially relax and leads to a layer of material that is at least partially relaxed 5. This relaxation is done by elastic deformation that is mainly lateral due to the presence of the stiffener 4 at its surface. The stiffener layer 4 contributes to limiting the speed of deformation by buckling, by forming cracks or by increasing surface roughness in favor of lateral deformation. But the stiffener 4 in contact with the strained material layer 3 opposes the relaxation of the strained material. As long as the opposition exerted by the stiffener, that depends in part on the thickness of the latter, is not insignificant faced with the force pushing towards relaxation, the relaxation of the strained material remains partial. This is why progressively reducing the thickness of the stiffener 4 while maintaining the reflow layer 2 at a temperature greater than the glass transition temperature allows continuous rebalancing of the forces at play and a total or at least partial lateral relaxation of the strained material may be obtained.

Preferably, the reflow layer 2 is brought beyond its glass transition temperature by heating the entire structure 10 in a heating device so that all of the layers constituting the structure 10 are also heated. But applying a local heat treatment at the level of the reflow layer 2 may also be done.

The stiffener layer 4 may also be constituted of a material deposited so as to be non strained, or advantageously with a compression or tension stress if the layer of material 3 presents a stress respectively in compression or in tension. The deposition methods used may be chosen from among liquid phase chemical deposition, chemical vapor deposition or molecular beam deposition.

The material of the stiffener layer 4 may be monocrystalline, polycrystalline or amorphous. It should present adapted thermo-mechanical properties to ensure a sufficient rigidity at the considered temperatures and to present the desired stiffening effect. The material may be in germanium or silicon or be constituted of a III/N material. If silicon is chosen, the silicon is preferably polycrystalline since it is less expensive to form. Its thickness may be between 50 nm and 1 micrometer.

The method for progressively reducing the thickness of the stiffener layer 4 may be dry etching of the plasma-assisted dry etching type, or dry etching by gas phase chemical reaction. The etching technique used must be compatible with the temperature of the heat treatment applied to the structure.

The thickness of the stiffener layer 4 may be reduced until the layer is completely removed. Whereas the duration of the heat treatment is dependent on the end of the etching, it is possible that the strained material of layer 3 is not completely or sufficiently relaxed. In this case, the heat treatment may be continued for several hours, for example in order to complete the relaxation of the strained material and lead to a layer 5 of a material that is completely or at least partially relaxed, mainly laterally.

According to the thermo-mechanical properties of the strained material from layer 3 and particularly its Young's modulus and the volume of the material to relax, the person skilled in the art may easily proceed with the necessary adjustments in order to optimize the reduction of the stiffener layer 4 so that the layer of material 3 at least partially relaxes, preferably laterally, while preventing the formation of buckling, cracks and surface roughness.

The layer of strained material 3 is preferentially in a polycrystalline or monocrystalline material. According to an embodiment in conformance with the invention, the strained material is a III/N material that comprises element III and nitrogen-based binary, ternary or quaternary alloy materials. Preferably the III/N material is monocrystalline InGaN with an indium content of between 3 and 35%. Even more preferably, the InGaN has an indium content of between 5 and 10%.

Figure 3:
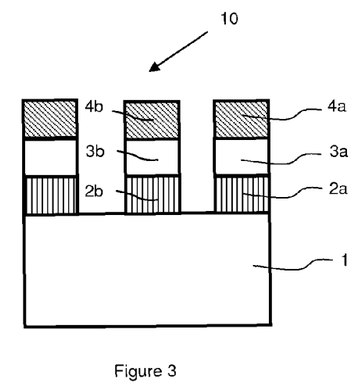
FIGS. 3 and 4 illustrate another embodiment according to the invention

According to another aspect of the invention, the layer of strained material 3 may be cut into islands of materials 3a, 3b as represented in FIG. 3. These islands allow the relaxation by buckling or forming cracks to be limited while promoting lateral relaxation. It then becomes possible to accelerate the thickness reduction speed of the stiffener layer 4 while conserving the mainly lateral relaxation that leads to a material that is at least partially laterally relaxed 5a, 5b illustrated in FIG. 4. These islands may be of any shape and size. Square shaped islands are preferred for practical reasons concerning their fabrication; their sizes may vary according to the initial stress of the material from 100 micrometers×100 micrometers to 3 mm×3 mm, for example. They may be formed by electromagnetic irradiation thanks to an irradiation source whose wavelength corresponds to the absorbent properties of the material. For example, a laser will allow islands to be formed in a III/N type nitrided material, more particularly, a laser with a wavelength of less than 400 nm will allow trenches to be etched to form GaN islands. These islands may also be formed by masking and etching, as is well known to the person skilled in the art.

According to one variation of the invention, patterns 2a, 2b, aligned on the islands of the strained material layer 3a, 3b are formed in at least one part of the thickness of the reflow layer 2 in order to further minimize the buckling process or the formation of cracks when the strained material relaxes. Depending on the case, the patterns are made in the entire thickness of the reflow layer 2 until distinct islands are obtained, as represented in FIG. 3. Preferably, these islands 2a, 2b have the same size as islands 3a, 3b of the strained material.

Figure 4:
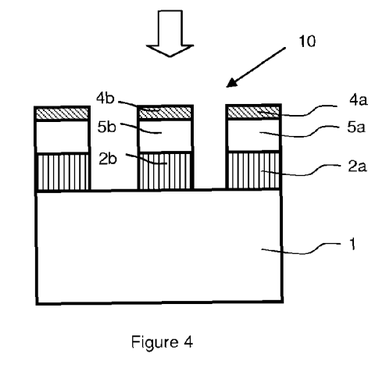

According to the embodiment of forming these islands 3a, 3b, the stiffener layer 4 is also cut in the form of islands 4a, 4b aligned on the islands of strained materials 3a, 3b as represented in FIG. 3 in order to optimize the relaxation in islands 5a, 5b as illustrated in FIG. 4.

Figure 5:
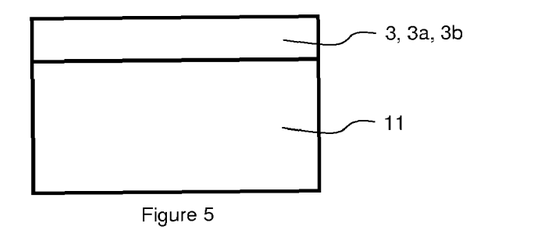
FIGS. 5 to 8 illustrate the different steps of fabricating a substrate for relaxing a strained layer in conformance with an embodiment of the invention.
Figure 10:
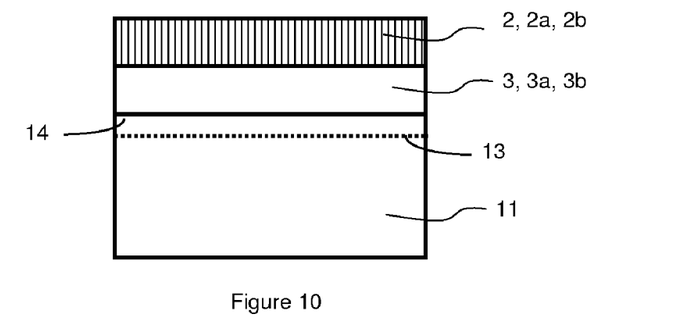

For purposes of further illustration and not limitation, the invention also relates to a method of fabricating a structure, such as structure 10 depicted in FIG. 5. As illustrated in FIG. 5, the strained material layer 3 is first of all deposited, for example by epitaxy, on a nucleation substrate 11 for which the lattice parameter of the material differs from that of the material of layer 3. The epitaxy may be carried out according to a known method such as MOVPE (Metal Organic Vapor Phase Epitaxy) or MBE (Molecular Beam Epitaxy) and a layer 3 that may be continuous in a monocrystalline or polycrystalline strained material is then obtained. A layer 3 of polycrystalline material may also be obtained by simple deposition. The thickness of this strained material layer 3 is preferably limited in order to prevent the accumulated stress from leading to plastic deformations, thus altering the crystallographic quality of the material of layer 3. It may vary according to the nature of the materials put in play between 50 nm to 2 micrometers, without creating defects of the dislocation or crack type during growth.

When the epitaxy is carried out with a mask formed on the nucleation substrate, a discontinuous layer 3 may be obtained and may comprise islands 3a, 3b with a size ranging from 50 micrometers×50 micrometers to 3 mm×3 mm. They may also be of any shape. The nucleation substrate 11 may be solid or composite. A composite substrate 11, comprising a seed layer 15 on which the layer 3 will be formed and a mechanical support 16, (not represented in the figures) presents the advantage of being able to separate the lattice parameter and thermal expansion coefficient stresses between the seed layer 15 and the mechanical support 16 or for example to limit the cost of the substrate if the mechanical support 16 is polycrystalline or if it may be recycled.

Figure 6:
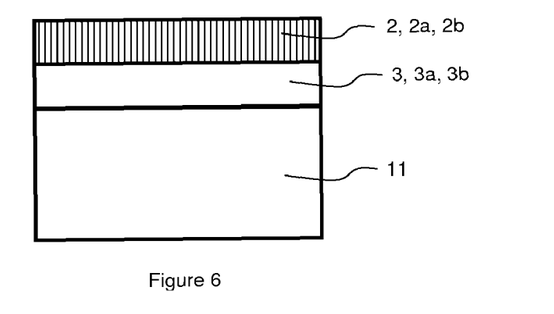
Figure 7:
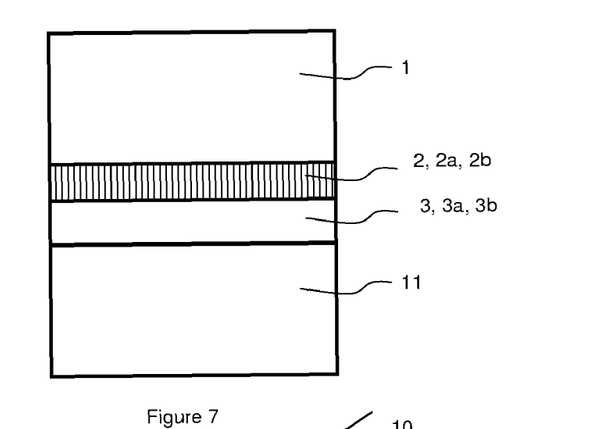

With reference to FIG. 6, a reflow layer 2, 2a, 2b is deposited on the strained material layer 3, 3a, 3b or on the strained material layer 3, 3a, 3b and the support substrate 1. The faces of layer 3, 3a, 3b and of support substrate 1 are then assembled through the reflow layer 2, 2a, 2b as illustrated in FIG. 7. This assembly may comprise molecular adhesion bonding. The reflow layer 2, 2a, 2b may then present a thickness from 0.1 micrometer to 5 micrometers.

Figure 8:
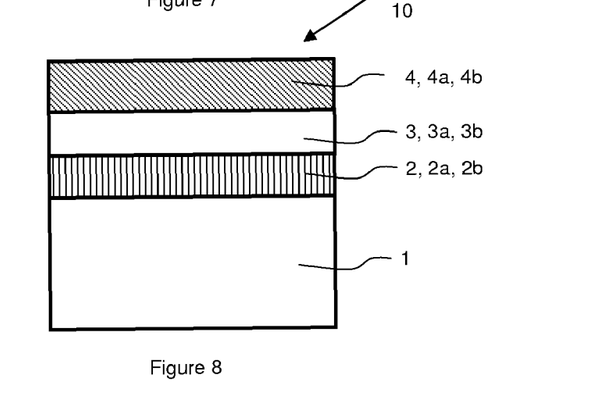

The nucleation substrate 11 is then removed at least partially from the layer 3. When the removal is complete, for example by mechanical or chemical thinning or electromagnetic irradiation at the interface with layer 3, the stiffener layer 4, 4a, 4b is deposited directly on the exposed face of the strained material layer 3, 3a, 3b until the desired thickness is obtained to lead to structure 10 represented in FIG. 8.

Figure 9:
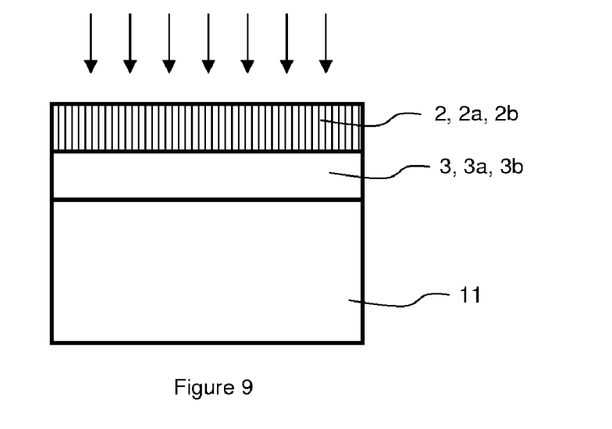
FIGS. 9 to 11 illustrate a variation of fabricating a substrate for relaxing a strained layer in conformance with an embodiment of the invention.
Figure 11:
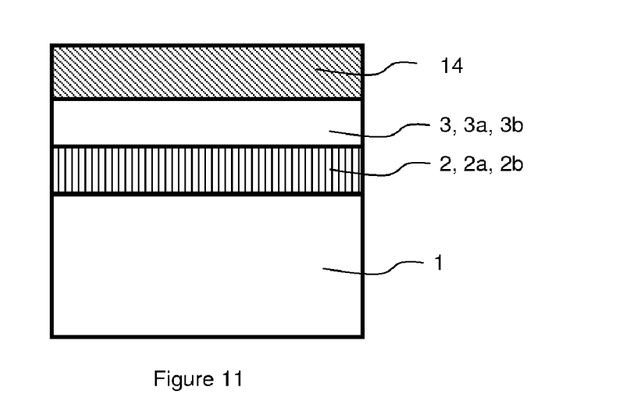

Partial removal of the nucleation substrate 11 may be obtained by mechanical and or chemical thinning or by splitting, for example at the level of an embrittlement zone 13 in the substrate 11 as illustrated in FIGS. 9 and 10. This embrittlement zone will have been formed previously in the substrate 11 by introducing ionic species, for example according to the Smart Cut™ technology, as represented in FIG. 9. The remainder 14 of the nucleation substrate 11 illustrated in FIG. 11 may then form at least one part of the stiffener layer 4. A layer of material may also be deposited on this remainder 14 to complete the formation of the desired stiffener layer 4. Alternately, the remainder 14 may be removed before the formation of the stiffener layer 4. The thickness of the remainder 14 varies according to the energy of the implanted ionic species and the thickness of the layers of material traversed by these species. It may be between 50 nm and 1 micrometer.

Figure 12:
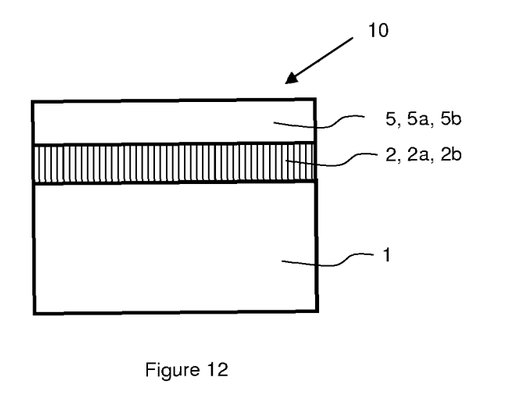
FIGS. 12 to 14 illustrate the fabrication of active layers on a layer of material that is at least partially relaxed that is obtained according to an embodiment of the invention.
Figure 13:
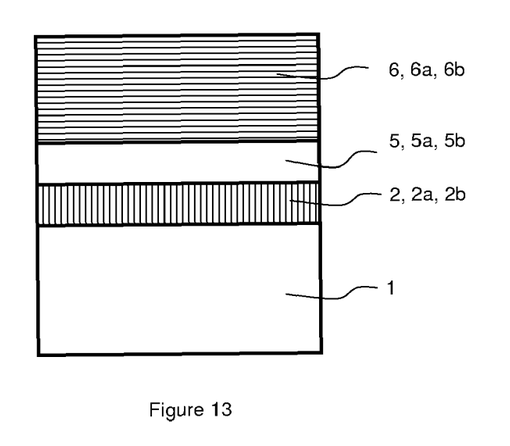

According to another aspect of the invention, once the heat treatment is applied and a layer of material that is at least partially relaxed 5, 5a, 5b, preferably laterally, as illustrated in FIG. 12, is obtained, the possible remainder of the stiffener layer 4, 4a, 4b is removed and epitaxy of one or more layers of material is performed to form one or more active layers 6, 6a, 6b as represented in FIG. 13. The materials of layers 5, 5a, 5b are preferably chosen to present, once at least partially laterally relaxed, a lattice parameter that is identical or very close to that of the material of the desired active layers 6, 6a, 6b. As these layers 5, 5a, 5b are used as seed layers, the active layers obtained 6, 6a, 6b thus have very good crystallographic quality. For example, for a completely relaxed layer 5, 5a, 5b in InGaN whose indium content is between 5 and 10%, the material of at least one of the active layers 6 will preferably be in InGaN comprising an indium range of 5 and 10%. The active layers 6 are thus relaxed and present a threading dislocation density of less than or equal to $5.10^{8}/cm^{2}$. They may present a cumulative thickness of 100 nm to 2 micrometers. These layers have the necessary crystallographic properties to be able to be used as laser or photovoltaic components or electroluminescent diodes.

In addition, when the epitaxy of the active layers 6, 6a, 6b is carried out directly on structure 10, it is preferable that the heat treatment temperature that enables relaxation be greater than the epitaxy temperature of the active layers. In the case of epitaxy of InGaN carried out at 800° C., the borophosphosilicate glass used will advantageously comprise a boron content of less than 4%.

Figure 14:
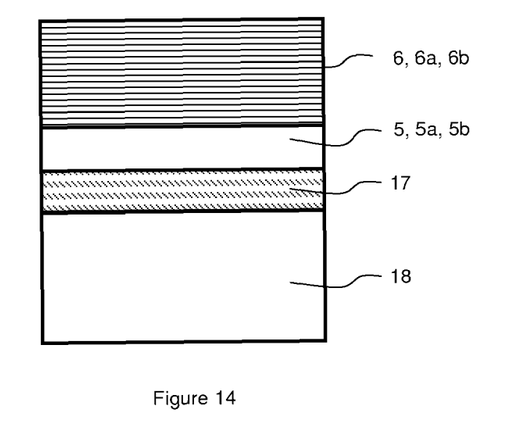

In the case of polar III/N materials, it is known that epitaxy is easier on the element III polarity face, that is, gallium for InGaN, than on an N polarity face. It may then be necessary to transfer the at least partially laterally relaxed layer of material 5, 5a, 5b on a final substrate 18 as illustrated in FIG. 14 via a bonding layer 17, in order to present the element III face for epitaxy of the active layers.

Figure 15:
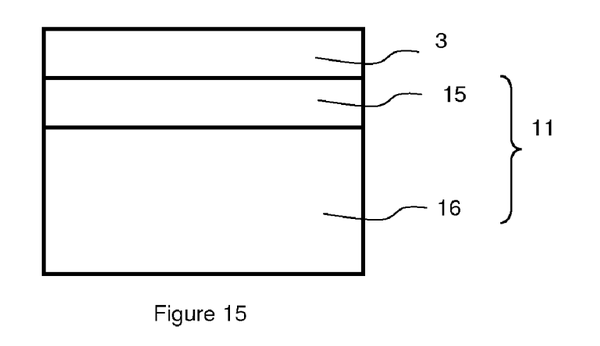
FIGS. 15 to 17 illustrate an exemplary method for fabricating a substrate for relaxing a strained layer in conformance with an embodiment of the invention.

An example of an embodiment in conformance with the invention is now described. With reference to FIG. 15, a layer of indium nitride and gallium (InGaN) 3 containing 10% indium and a thickness of 50 nm is deposited by epitaxy on a nucleation substrate 11, constituted of a mechanical support 16 in sapphire covered by a seed layer 15 of gallium nitride GaN.

This layer of InGaN presents a lattice parameter difference of approximately 1% with the seed layer 15 of gallium nitride on which it is formed. It presents a dislocation density of less than or equal to $5.10^{8}/cm^{2}$ and preferably a density of less than or equal to $1.10^{8}/cm^{2}$.

Figure 16:
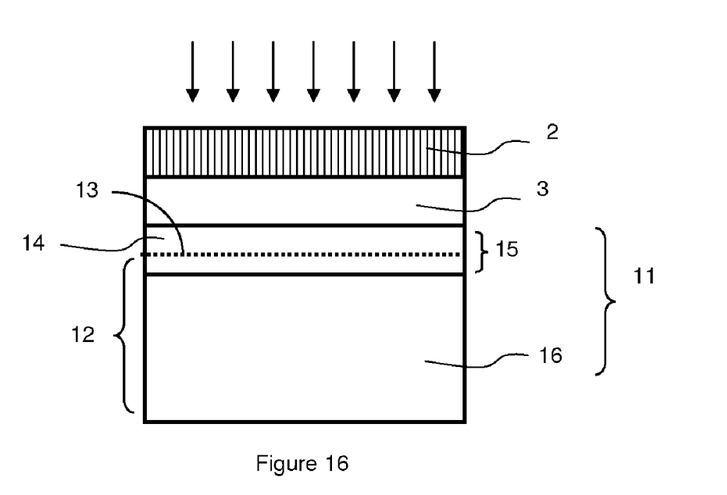

A reflow layer 2 in borophosphosilicate glass whose boron content is 4.5% is then deposited on the layer of InGaN 3, as illustrated in FIG. 16, with a thickness of approximately 500 nm Optionally, a buried layer of $SiO_2$ of 50 nm (not represented in the diagram) is deposited on the gallium face of InGaN in order to improve the adhesion of the material with the substrate 1.

Hydrogen ions or hydrogen and helium ions are then implanted with a total dose of between 2.5 and $6.10^{17}$ atoms/$cm^{2}$, in the GaN, through the layer of InGaN and the layer of borophosphosilicate glass to form an embrittlement zone 13. This embrittlement zone delimits, on the one hand, a negative 12 comprising the mechanical support in sapphire and the remainder of the gallium layer and on the other hand a remainder 14 constituted of GaN with a thickness of 150 nm as illustrated in FIG. 16.

A layer of borophosphosilicate glass is deposited on the support substrate 1 with a thickness of 1 micrometer, then the exposed surfaces of the borophosphosilicate glass layers deposited on the support 1 and on the layer of InGaN 3 are polished (not represented in the figures) for example by a CMP (Chemical Mechanical Polishing) technique before putting them in close contact. The reflow layer 2 in borophosphosilicate glass thus formed presents a thickness of approximately 1 micrometer due to the removal of 500 nm of material during polishing.

Figure 17:
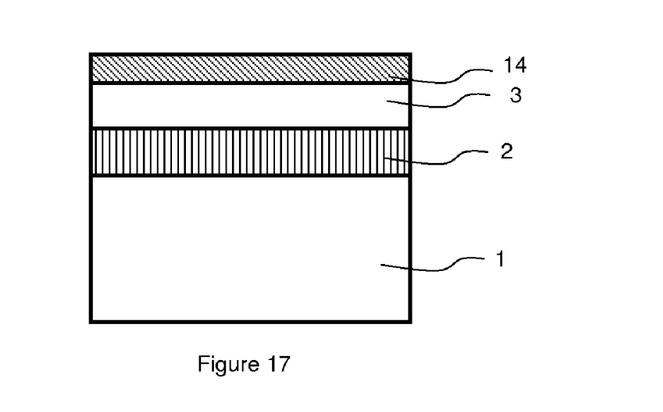

A splitting heat treatment is then applied in order to detach the remainder 14 from the negative 12 at the level of the embrittlement zone 13 formed in the nucleation substrate 11. This heat treatment may be completed by the input of mechanical or any other type of energy. With reference to FIG. 17, the layer of InGaN 3 transferred onto the support substrate 1 is obtained through the reflow layer 2 and the remainder 14 formed of GaN is then used as the stiffener layer 4.

Figure 18:
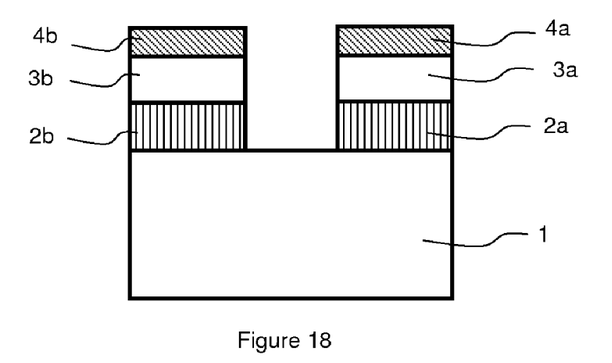
FIGS. 18 to 20 illustrate an exemplary method for relaxing strained material layer islands in conformance with an embodiment of the invention, wherein the islands are transferred to expose the desired polarity of the material.

Optionally and with reference to FIG. 18, the remainder 14, the strained layer of InGaN 3 and the reflow layer 2 are etched by a standard lithography/etching method in order to obtain square islands respectively comprising stiffener layers 4a, 4b, the strained material layers 3a, 3b and the reflow layers 2a, 2b having a dimension of 1 mm×1 mm. The remainder 14 being assimilated to the stiffener layer 4, it is referenced by 4 as well as for islands 14a and 14b referenced by 4a and 4b.

Figure 19:
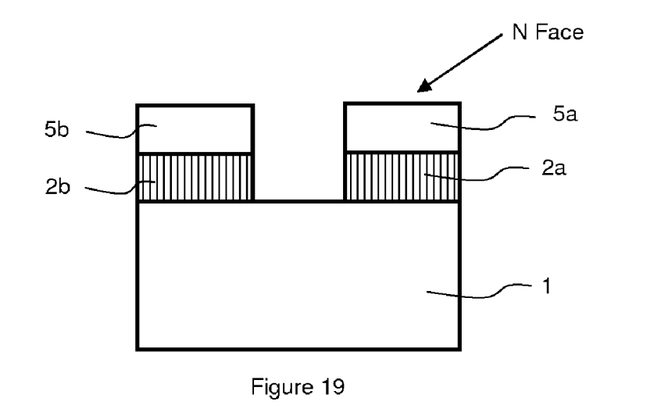

A heat treatment in a neutral gas atmosphere containing HCl is applied to the structure to bring the reflow layer 2a, 2b beyond its glass transition temperature, for example to 850° C. for 4 hours. The stiffener layer 4a, 4b is thinned during the heat treatment by the etching effect of the atmosphere containing HCl. The heat treatment in neutral gas atmosphere is continued beyond the total removal of the stiffener layer 4, 4a, 4b in order to obtain complete lateral relaxation, that is, without buckling or other deteriorations in the crystalline quality of the material, of the layer of InGaN 3, 3a, 3b in the layer of InGaN 5, 5a, 5b, as illustrated in FIG. 19.

Figure 20:
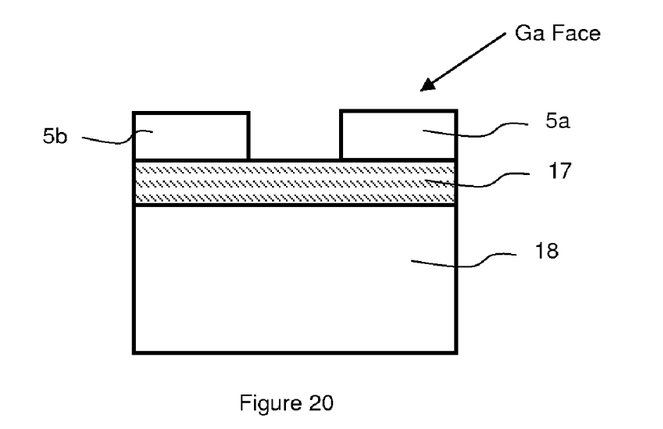

The exposed face of the layer of InGaN 5, 5a, 5b presents a polarity N due to its transfer onto substrate 1. It is then again transferred onto a support substrate 18, by assembly of the structure presented in FIG. 19 and removal of substrate 1 and layers 2a, 2b, via a bonding layer 17 as represented in FIG. 20.

Thus the layer of InGaN material 5, 5a, 5b presents an exposed gallium polarity face. Active layers 6, 6a, 6b comprising one or more layers in III/N material such as 10% InGaN or with a comparable indium content may then be deposited by epitaxy on the gallium face of the layer of InGaN 5, 5a, 5b that is completely and laterally relaxed.

According to a second example of embodiment of the invention, the layer of InGaN 3 with an indium content of 5% is deposited discontinuously, on the nucleation substrate 11 by using a mask. The thickness of this layer is 100 nm and the islands 3a and 3b thus formed present a size of 1 mm×1 mm.

The reflow layer 2a, 2b is also deposited discontinuously and aligned on islands 3a, 3b. The reflow layer material is borophosphosilicate glass with 4.5% boron. The layer 2a, 2b is deposited with a thickness of 2 micrometers. Then the layer 3a, 3b and the support substrate 1 are assembled through the reflow layer 2a, 2b after a CMP polishing step applied to the layer that participates in the removal of 1 micrometer of its thickness.

The nucleation substrate 11 is completely removed by mechanical thinning and a discontinuous stiffening layer 4a, 4b of polycrystalline silicon is deposited on islands 3a, 3b with a thickness of 200 nm and is deposited so as to be aligned with islands 3a, 3b.

A heat treatment at 950° C. for 4 hours in a neutral gas and HCl atmosphere is applied to the structure to thin the stiffener layer 4, 4a, 4b in silicon. The silicon may in fact be etched at this temperature by an atmosphere containing HCl which enables relaxation to be obtained at the same time. The heat treatment is continued 2 hours beyond the complete removal of the stiffener layer 4a, 4b in order to obtain at least partial relaxation of the layer of InGaN 3a, 3b in the layer of InGaN 5a, 5b. Subsequent steps for transferring the layer 5a, 5b in view of the formation of active layers 6a, 6b are in conformance with those described in the first example.

The methods and systems of the present invention, as described above and shown in the drawings, provide superior approaches of forming layers that are at least partially relaxed. It will be apparent to those skilled in the art that various modifications and variations can be made in the devices and methods of the present invention without departing from the spirit or scope of the invention. Thus, it is intended that the present invention include modifications and variations that are within the scope of the appended claims and their equivalents.

The invention claimed is:

1. A method of fabricating a layer of material that is at least partially relaxed for electronics, optoelectronics or photovoltaics comprising:
   a) supplying a structure that includes a layer of strained material situated between a reflow layer and a stiffener layer;
   b) applying a heat treatment that brings the reflow layer to a temperature equal to or greater than the glass transition temperature of said reflow layer, wherein the thickness of the stiffener layer is progressively reduced during the heat treatment.

2. The method of claim 1, wherein the heat treatment is applied to the entire structure.

3. The method of claim 1, wherein the structure includes a support substrate on which the reflow layer is situated.

4. The method of claim 1, wherein the material of the stiffener layer is monocrystalline, polycrystalline or amorphous.

5. The method of claim 1, wherein the reduction of the thickness of the stiffener layer is carried out by dry etching.

6. The method of claim 5, wherein the etching includes gas phase chemical reaction etching.

7. The method of claim 1, further comprising forming islands of material in the layer of strained material before heat treatment.

8. The method of claim 7, wherein the island forming step is carried out by at least one of etching and electromagnetic irradiation.

9. The method of claim 7, wherein patterns aligned with the islands are formed in at least a portion of the thickness of the reflow layer.

10. The method of claim 1, wherein the layer of strained material is formed by:
    a) depositing the strained material layer on a nucleation substrate;
    b) assembling the strained material layer and the support substrate by way of the reflow layer; and
    c) forming the stiffening layer.

11. The method of claim 10, wherein the stiffener layer is formed at least in part by partially removing the nucleation substrate.

12. The method of claim 10, wherein the nucleation substrate is completely removed, and wherein the stiffener layer is formed by deposition on the strained material layer.

13. The method of claim 11, wherein the nucleation substrate is removed by splitting.

14. The method of claim 12, wherein the nucleation substrate is removed by splitting.

15. The method of claim 1, wherein the thickness of the stiffener layer is reduced until the stiffener layer is completely removed.

16. The method of claim 15, wherein heat treatment is continued after the stiffener layer is completely removed.

17. The method of claim 1, wherein the reflow layer includes at least one low-viscosity material.

18. The method of claim 17, wherein the low viscosity material includes borophosphosilicate glass.

19. The method of claim 18, wherein the borophosphosilicate glass includes between 3% and 7% boron.

20. The method of claim 18, wherein the borophosphosilicate glass includes between 3% and 5% boron.

21. The method of claim 1, wherein heat treatment is carried out between 750° C. and 1050° C.

22. The method of claim 1, wherein heat treatment is carried out between 850° C. and 950° C.

23. The method of claim 1, wherein the stiffener layer includes at least one of polycrystalline silicon, germanium and a III/N material.

24. The method of claim 1, wherein the strained material layer is a monocrystalline III/N material.

25. The method of claim 24, wherein the strained material includes InGaN.

26. The method of claim 1, wherein the stiffener layer includes GaN, the strained material layer includes InGaN, and the etching of the stiffener layer is carried out in an atmosphere including HCl.

27. The method of claim 1, further comprising forming at least one active layer on the at least partially relaxed material layer.

28. The method of claim 27, wherein the active layer includes at least one of laser components, photovoltaic components and electroluminescent diodes.

29. The method of claim 27, further comprising transfering the layer of at least partially relaxed material onto a final substrate before forming the at least one active layer.

30. The method of claim 27, wherein the at leat one active layer is formed on the layer of at least partially relaxed material, and wherein the glass transition temperature of the reflow layer is greater than the temperature for forming the at least one active layer.

31. The method of claim 27, wherein the layer of at least partially relaxed material includes a III/N material, the at least one active layer includes a III/N material, and the formation of the at least one active layer is carried out by epitaxy on a face of polarity of the III element of the material from the layer of at least partially relaxed material.

* * * * *